(12) United States Patent
Suzuki

(10) Patent No.: US 8,352,674 B2
(45) Date of Patent: Jan. 8, 2013

(54) SEMICONDUCTOR MEMORY INFORMATION STORAGE APPARATUS AND METHOD OF CONTROLLING WRITING

(75) Inventor: Toshio Suzuki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 329 days.

(21) Appl. No.: 12/685,044

(22) Filed: Jan. 11, 2010

(65) Prior Publication Data

US 2010/0115194 A1    May 6, 2010

Related U.S. Application Data

(63) Continuation of application No. PCT/JP2008/062422, filed on Jul. 9, 2008.

(30) Foreign Application Priority Data

Jun. 13, 2007   (JP) ................................. 2007-184433

(51) Int. Cl.
  *G06F 12/00*   (2006.01)
  *G11C 16/10*   (2006.01)
(52) U.S. Cl. .. 711/103; 711/115; 711/154; 711/E12.008
(58) Field of Classification Search .......................... None
  See application file for complete search history.

(56) References Cited

U.S. PATENT DOCUMENTS

| 5,737,742 A | 4/1998 | Achiwa |
| 5,930,193 A | 7/1999 | Achiwa et al. |
| 2004/0083335 A1 | 4/2004 | Gonzalez et al. |
| 2005/0141312 A1* | 6/2005 | Sinclair et al. ................ 365/222 |
| 2006/0203546 A1 | 9/2006 | Lasser |
| 2008/0215833 A1* | 9/2008 | Suzuki .......................... 711/159 |
| 2009/0043950 A1* | 2/2009 | Suzuki .......................... 711/103 |
| 2010/0211737 A1* | 8/2010 | Flynn et al. ................... 711/114 |

FOREIGN PATENT DOCUMENTS

| JP | 8-16482 | 1/1996 |
| JP | 11-144478 | 5/1999 |
| JP | 11-259370 | 9/1999 |
| TW | 2004/17860 A | 9/2004 |
| TW | 2006/01041 A | 1/2006 |

(Continued)

OTHER PUBLICATIONS

International Search Report from Japanese Patent Office in International Application No. PCT/JP2008/062422 mailed Oct. 21, 2008.

(Continued)

*Primary Examiner* — Jasmine Song
*Assistant Examiner* — Daniel Bernard
(74) *Attorney, Agent, or Firm* — Finnegan, Henderson, Farabow, Garrett & Dunner, L.L.P.

(57) ABSTRACT

A semiconductor memory information storage apparatus includes a storage unit using a nonvolatile memory, a write number manager counting each of numbers of times of writing of all blocks, a list manager classifying the blocks in the nonvolatile memory by in-use/unused, managing in an in-use list a block of the in-use, managing in a first unused list a block with the number of times of writing equal to a maximum value, and managing in a second unused list a block with the number of times of writing less than the maximum value, and a controller writing and erasing information data to and from the storage unit.

6 Claims, 6 Drawing Sheets

FOREIGN PATENT DOCUMENTS

WO    WO 2004/040578 A2    5/2004

OTHER PUBLICATIONS

European Search Report mailed by the European Patent Office on Aug. 25, 2011 for counterpart Application No. 08791009.7, 7 pages.

Taiwanese Office Action in corresponding Taipei Patent Application No. 097126475, mailed Jan. 31, 2012 (7 pages).

International Preliminary Report on Patentability for PCT/JP2008/062422, dated Feb. 9, 2010 (5 pages).

* cited by examiner

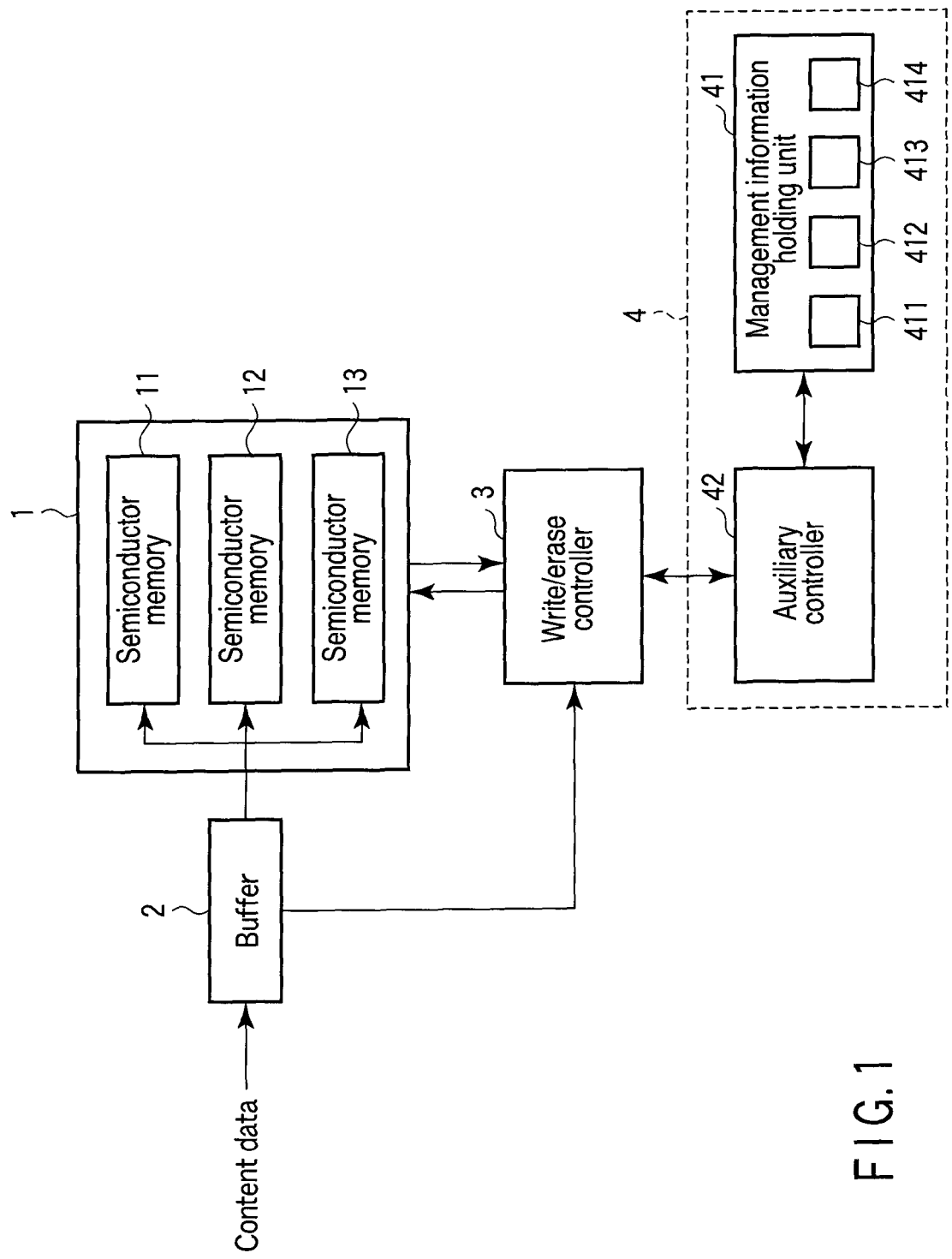
F I G. 1

SEMICONDUCTOR MEMORY INFORMATION STORAGE APPARATUS AND METHOD OF CONTROLLING WRITING

CROSS REFERENCE TO RELATED APPLICATIONS

This is a Continuation Application of PCT Application No. PCT/JP2008/062422, filed Jul. 9, 2008, which was published under PCT Article 21(2) in Japanese.

This application is based upon and claims the benefit of priority from prior Japanese Patent Application No. 2007-184433, filed Jul. 13, 2007, the entire contents of which are incorporated herein by reference.

BACKGROUND OF THE INVENTION

1. Field of the Invention

The present invention relates to a semiconductor memory information storage apparatus which stores information, such as content data, in a semiconductor memory, and a method of controlling writing for storing information, such as content data, in a semiconductor memory.

2. Description of the Related Art

Some information storage apparatuses which store content data utilize, as their storage media, semiconductor memories which allow data to be written and read in units of blocks. This semiconductor memory has an advantage of high reliability because it includes no operating part. On the other hand, the number of times data can be written to the semiconductor memory is small as compared to the case of writing to a hard disk or the like. In particular, if only a specific block is used, the block becomes a defective area (called an "acquired backdrop"). One of conventional techniques which overcome such a kind of problem is disclosed in Jpn. Pat. Appln. KOKAI Publication No. 11-144478. In a semiconductor memory information storage apparatus disclosed in this patent document, the number of times of writing is counted by block every time content data is written to a semiconductor memory. At the time of writing data, the number of times of writing of every block is read, and content data is written to unused blocks in ascending order of the number of times of writing.

However, in recent years, the capacity of a semiconductor memory has been upsizing. A method of reading the number of times of writing for all blocks every time data is written and then selecting an unused block with a small number of times of writing as disclosed in patent document 1 is no longer an efficient approach. Accordingly, there is a need for an information storage apparatus which can select an unused block in real time during operation of writing content data and can cause the number of times of writing to be uniform among all blocks.

BRIEF SUMMARY OF THE INVENTION

An object of the invention is to provide a semiconductor memory information storage apparatus and a method of controlling writing which allow an unused block to be selected in real time during writing operation of content data, enabling the number of times of writing of blocks to be uniform.

A semiconductor memory information storage apparatus according to an aspect of the invention comprising: a storage unit which uses as an information storage medium a nonvolatile memory which allows erasing in units of blocks; a write number manager which counts each of numbers of times of writing of all blocks in the nonvolatile memory to perform management; a list manager which classifies the blocks in the nonvolatile memory by in-use/unused, manages in an in-use list a block of the in-use, manages in a first unused list a block with the number of times of writing equal to a maximum value, among blocks of the unused, and manages in a second unused list a block with the number of times of writing less than the maximum value, among the blocks of the unused; and a controller which writes and erases information data to and from the storage unit, the controller, during writing of the information data, selectively specifying any one of blocks managed in the second unused list and writing the information data in the block, and, during erasing of the information data, erasing the information data from the block and notifying the list manager about the block of the erasing to cause management of the block to be updated, wherein when any one of the blocks managed in the second unused list by the controller is specified as a write block, the list manager removes the specified write block from the second unused list and shifts the write block to management in the in-use list, and the write number manager increments the number of times of writing of the specified write block.

A method of distributing a write area according to another aspect of the invention comprising: using as an information storage medium a nonvolatile memory which allows erasing in units of blocks; counting each of numbers of times of writing of all blocks in the nonvolatile memory to perform management; classifying the blocks in the nonvolatile memory by in-use/unused; managing in an in-use list a block of the in-use; managing in a first unused list a block with the number of times of writing equal to a maximum value, among blocks of the unused; managing in a second unused list a block with the number of times of writing less than the maximum value, among the blocks of the unused; during writing of the information data to a block in the nonvolatile memory, referring to the second unused list, selectively specifying any one of blocks managed in the second unused list, and writing the information data in the block; during erasing of the information data, erasing the information data from the block and updating management of the block of the erasing in each of the lists; when any one of the blocks managed in the second unused list is specified as a write block, removing the specified write block from the second unused list and shifting the write block to management in the in-use list; and incrementing the number of times of writing of the specified write block.

BRIEF DESCRIPTION OF THE SEVERAL VIEWS OF THE DRAWING

FIG. 1 is a block diagram showing a configuration of one embodiment of a semiconductor memory information storage apparatus according to the invention.

DETAILED DESCRIPTION OF THE INVENTION

Figure 2:
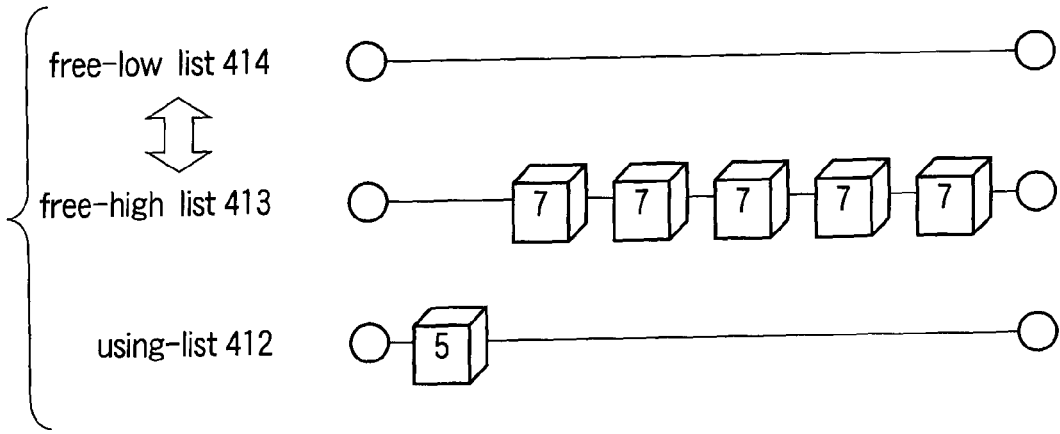
FIG. 2 is a conceptual view showing a shift of registration of unused blocks in a block management unit of FIG. 1 in the cases where unused blocks are not registered in a free-low list and are registered only in a free-high list.

An embodiment of the invention will be described in detail below with reference to the drawings.

FIG. 1 is a block diagram showing a functional configuration of a semiconductor memory information storage apparatus according to a first embodiment of the invention. In FIG. 1, a storage unit 1 fetches content data temporarily saved in a buffer 2 by write control of a write/erase controller 3, and writes the content data to semiconductor memories 11 to 13. At this point, referring to a block management unit 4, the write/erase controller 3 specifies write blocks in the semiconductor memories 11 to 13 to which content data is to be written. The block management unit 4 holds management information on blocks of the semiconductor memories 11 to 13 in a management information holding unit 41, and manages the blocks by control of the management information by an auxiliary controller 42.

The storage unit 1 erases content data stored in the semiconductor memories 11 to 13 by erase control of the write/erase controller 3. At this point, the write/erase controller 3 notifies the block management unit 4 about the block from which the content data has been erased so as to cause management of the block to be updated.

The storage unit 1 is configured such that a plurality of (three in this case) nonvolatile semiconductor memories 11 to 13 in each of which data is erasable in units of blocks are connected in parallel to one another. All the semiconductor memories store data of the same information. As a result, even if a defective portion is generated in any semiconductor memory, data is stored in the residual semiconductor memories. In other words, the possibility of occurrence of a write error is reduced.

The write/erase controller 3 has a function of controlling writing and erasing of content data to and from the storage unit 1. The write/erase controller 3 selectively specifies an unused block with a small number of times of writing from the block management unit 4 at the time of writing control. The write/erase controller 3 writes, in the specified block, content data temporarily saved in the buffer 2. At the time of erase control, the write/erase controller 3 erases content data from the block. The write/erase controller 3 notifies the block management unit 4 about the block from which the content data has been erased so as to cause management of the block to be updated.

The block management unit 4 holds management information on blocks of the semiconductor memories 11 to 13 in the management information holding unit 41. The block management unit 4 controls the management information by the auxiliary controller 42 to manage the blocks.

The management information holding unit 41 comprises a recording unit 411, a list management unit (hereinafter, referred to as a "using-list") 412, a list management unit (hereinafter, referred to as a "free-high list") 413 and a list management unit (hereinafter, referred to as a "free-low list") 414. The recording unit 411 records in-use/unused classification results and the numbers of times of writing of blocks of the semiconductor memories 11 to 13. The using-list 412 manages in-use blocks. The free-high list 413 manages, among unused blocks, blocks each of which has the number of times of writing equal to the maximum number of times of use. The free-low list 414 manages, among unused blocks, blocks with the number of times of writing less than the maximum number of times of use. The term "the maximum number of times of use" refers to the number of times of writing of a block which is maximum among the numbers of times of writing of unused blocks.

When a write block is selectively specified from any one of blocks registered in the free-low list 414 by the write/erase controller 3, the auxiliary controller 42 removes the block from the free-low list 414. Then, the auxiliary controller 42 increments the number of times of writing of the block, and records the number of times of writing in the recording unit 411. Upon recording the number of times of writing, the auxiliary controller 42 registers the block in the using-list 412.

When the auxiliary controller 42 receives from the write/erase controller 3 a notification about the block from which content data has been erased, the auxiliary controller 42 removes the block from the using-list 412 and handles the block as an unused block. Then the auxiliary controller 42 compares the number of times of writing of the unused block with the maximum number of times of use. If the number of times of writing of the block from which the content data has been erased is less than the maximum number of times of use, then the auxiliary controller 42 registers the block in the free-low list 414. If the number of times of writing of the block from which the content data has been erased is equal to the maximum number of times of use, then the auxiliary controller 42 registers the block in the free-high list 413. If the number of times of writing of the block from which the content data has been erased is greater than the maximum number of times of use, then the auxiliary controller 42 registers in the free-low list 414 unused blocks which have been registered in the free-high list 413, and registers in the free-high list 413 the block from which the content data has been erased.

Upon start-up of the semiconductor memory information storage apparatus, the auxiliary controller 42 performs the following processing referring to the in-use/unused classification result and the number of times of writing of each block which have been recorded in the recording unit 411. That is, the auxiliary controller 42 registers in-use blocks in the using-list 412 upon start-up. The auxiliary controller 42 registers in the free-high list 413 blocks each of which has the number of times of writing equal to the maximum number of times of use, among unused blocks. The auxiliary controller 42 registers in the free-low list 414 blocks each of which has the number of times of writing less than the maximum number of times of use, among unused blocks.

Further, if unused blocks are not registered in the free-low list 414 and are registered only in the free-high list 413, then the auxiliary controller 42 registers in the free-low list 414 all the blocks registered in the free-high list 413. A conceptual view of registering of blocks at this point is shown in FIG. 2. Note that if all blocks are registered in the using-link 412, no unused block exists in the storage unit 1, and a signal representing that storing in the storage unit 1 is impossible is sent to the write/erase controller 3.

Next, in the semiconductor memory information storage apparatus with the configuration mentioned above, management of blocks in the block management unit 4 is described with reference to FIGS. 3 to 9.

Figure 3:
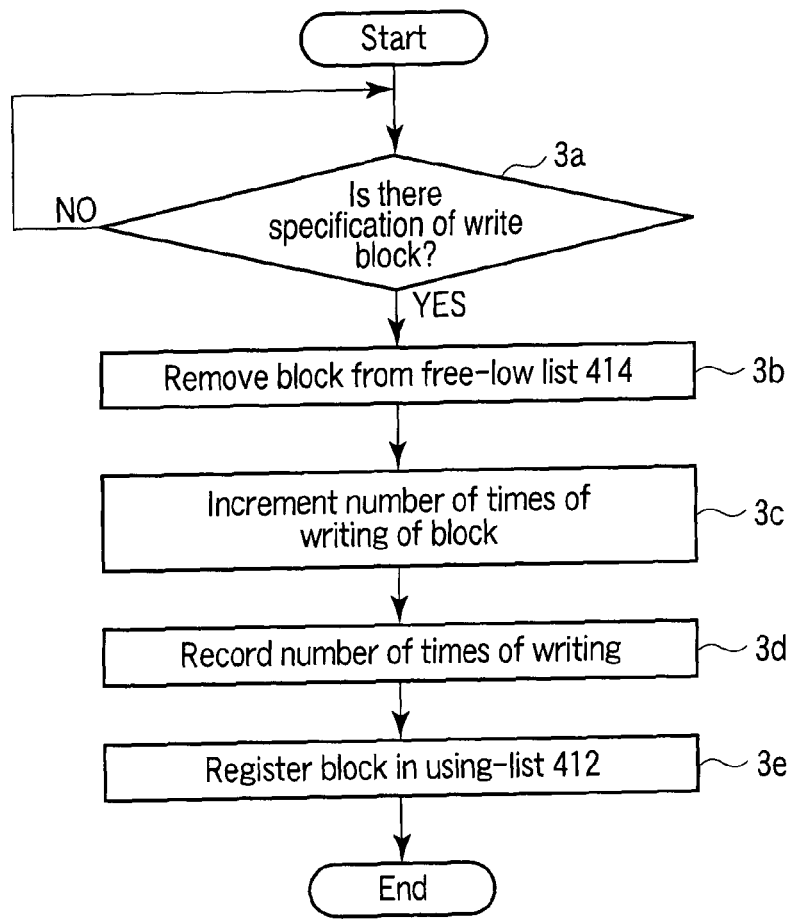
FIG. 3 is a flow chart showing management operation of blocks by an auxiliary controller at the time of writing content data in a storage unit of FIG. 1.
Figure 4:
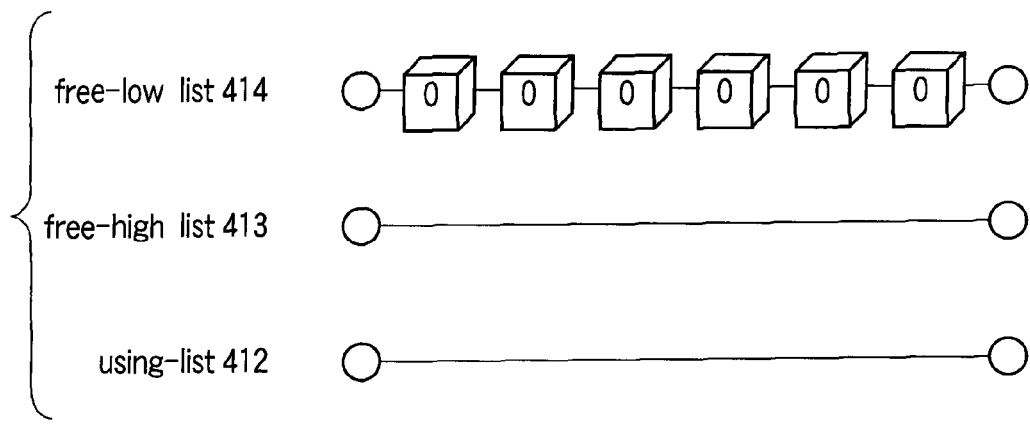
FIG. 4 is a conceptual view showing management of blocks at the time of writing content data in the storage unit of FIG. 1.
Figure 5:
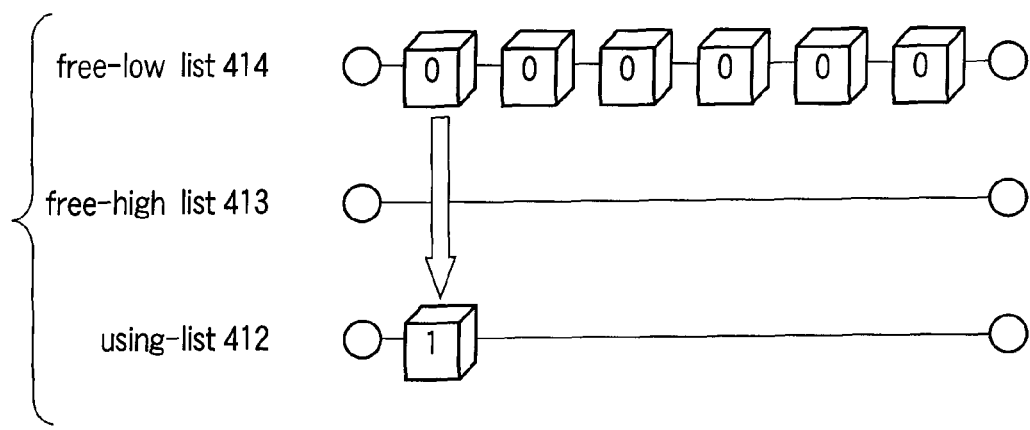
FIG. 5 is a conceptual view showing management of blocks at the time of writing content data in the storage unit of FIG. 1.

FIG. 3 is a flow chart showing management operation of blocks by the auxiliary controller 42 at the time of writing content data in the storage unit 1 according to the present embodiment. FIG. 4 is a conceptual view showing the initial state of management of blocks at the time of writing content data in the storage unit 1. FIG. 5 is a conceptual view showing management of blocks during first writing of content data in the storage unit 1.

In the initial state, all unused blocks in the semiconductor memories 11 to 13 are registered in the free-low list 414 (FIG. 4). If the auxiliary controller 42 receives specification of a write block from the write/erase controller 3 (step 3a), then the auxiliary controller 42 removes the specified block from the free-low list 414 (step 3b). Subsequently, the auxiliary controller 42 increments the number of times of writing of this block (step 3c), and records the number of times of writing in the recording unit 411 (step 3d). After recording the number of times of writing, the auxiliary controller 42 registers this block in the using-list 412 (step 3e) (FIG. 5), and the process ends.

Figure 6:
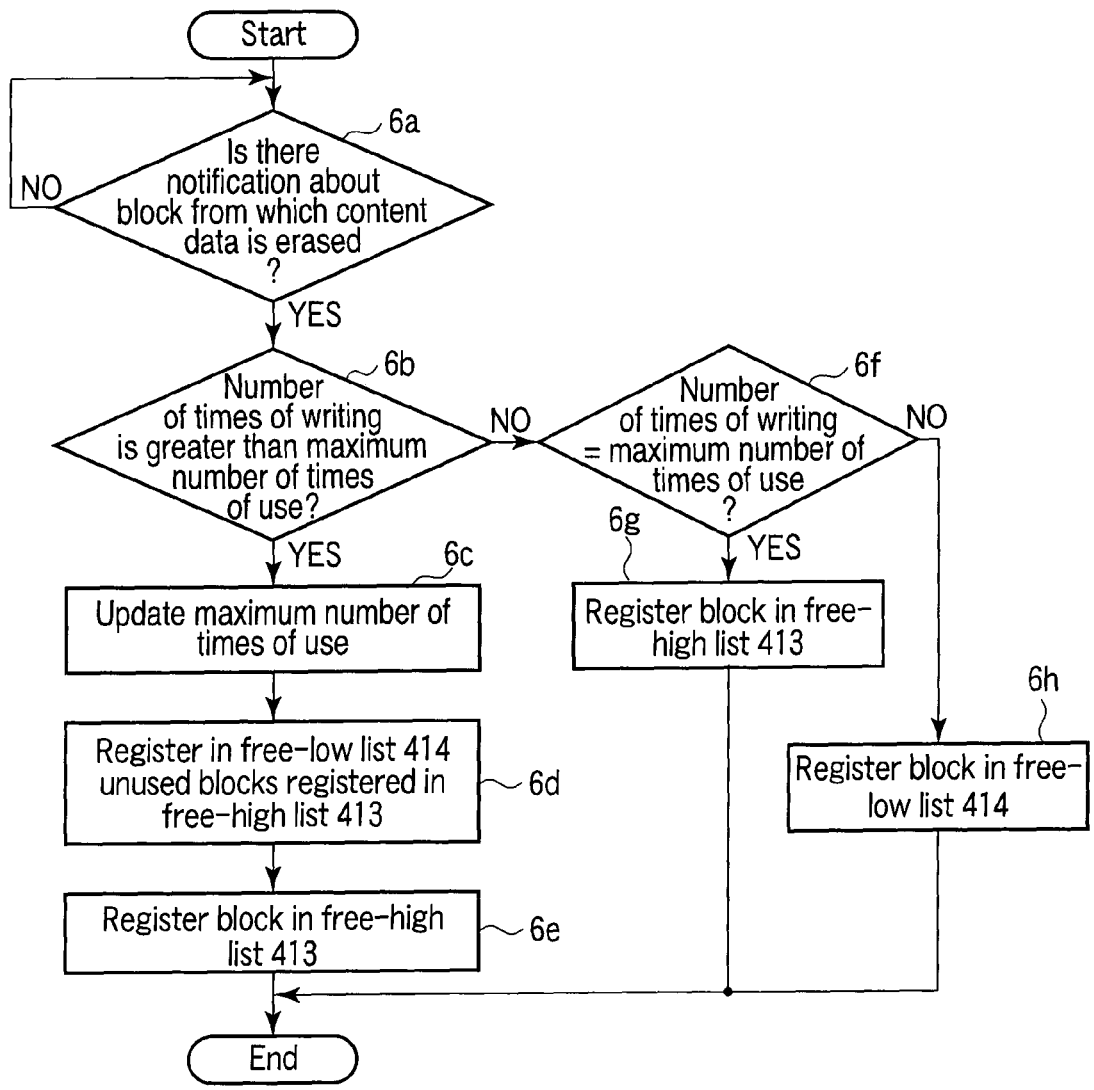
FIG. 6 is a flow chart showing management operation by the auxiliary controller at the time of erasing content data stored in a block of the storage unit of FIG. 1.
Figure 7:
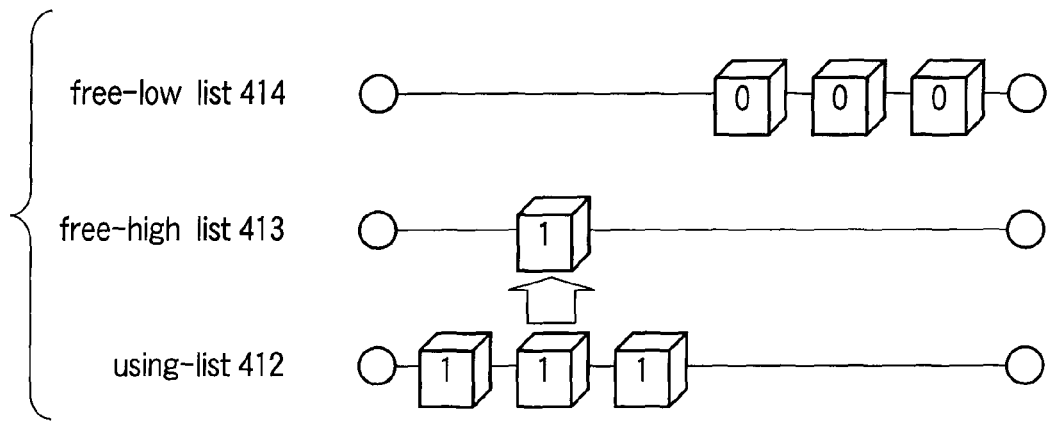
FIG. 7 is a conceptual view showing block management at the time of erasing content data stored in the block of the storage unit of FIG. 1.
Figure 8:
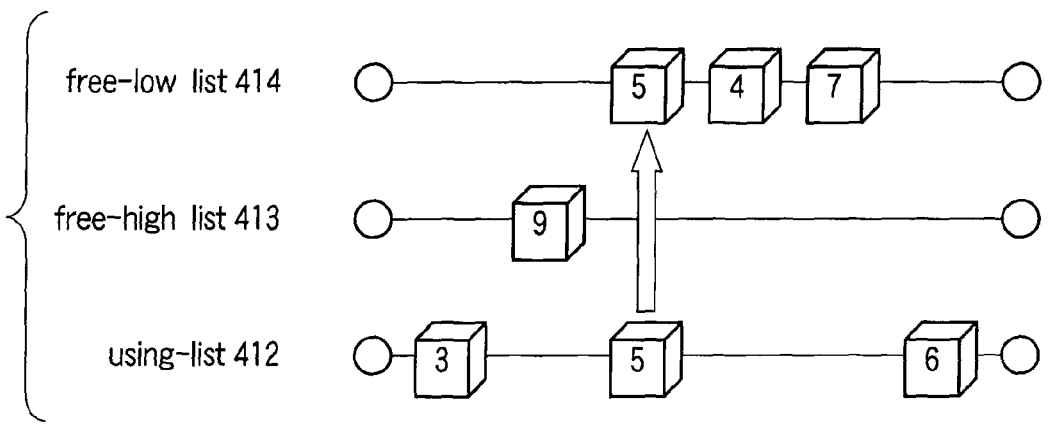
FIG. 8 is a conceptual view showing block management at the time of erasing content data stored in the block of the storage unit of FIG. 1.

FIG. 6 is a flow chart showing management operation of blocks by the auxiliary controller 42 at the time of erasing content data stored in a block of the storage unit 1 according to the present embodiment. FIG. 7 is a conceptual view of block management at the time of registering in the free-high list 413 a block of the storage unit 1 after erasing content data stored in the block. FIG. 8 is conceptual view of block management at the time of registering in the free-low list 414 a block of the storage unit 1 after erasing content data stored in the block.

First, when the auxiliary controller 42 is notified by the write/erase controller 3 about a block from which the stored content data has been erased (step 6a), the auxiliary controller 42 determines whether or not the number of times of writing of the block is greater than the maximum number of times of use (step 6b). If the number of times of writing is greater than the maximum number of times of use (Yes in step 6b), then the auxiliary controller 42 updates the maximum number of times of use (step 6c), and registers in the free-low list 414 all blocks which have been registered in the free-high list 413 (step 6d). Thereafter, the auxiliary controller 42 registers in the free-high list 413 the block from which content data has been erased (step 6e), and the process ends.

If, in step 6b, the number of times of writing of the block from which content data has been erased is equal to or less than the maximum number of times of use (No in step 6b), the auxiliary controller 42 determines whether or not the number of times of writing is equal to the maximum number of times of use (step 6f). If the number of times of writing is equal to the maximum number of times of use (Yes in step 6f), then the unused block is registered in the free-high list 413 (step 6g) (FIG. 7), and the process ends. If the number of times of writing is less than the maximum number of times of use (No in step 6f), the unused block is registered in the free-low list 414 (step 6h) (FIG. 8), and the process ends.

Figure 9:
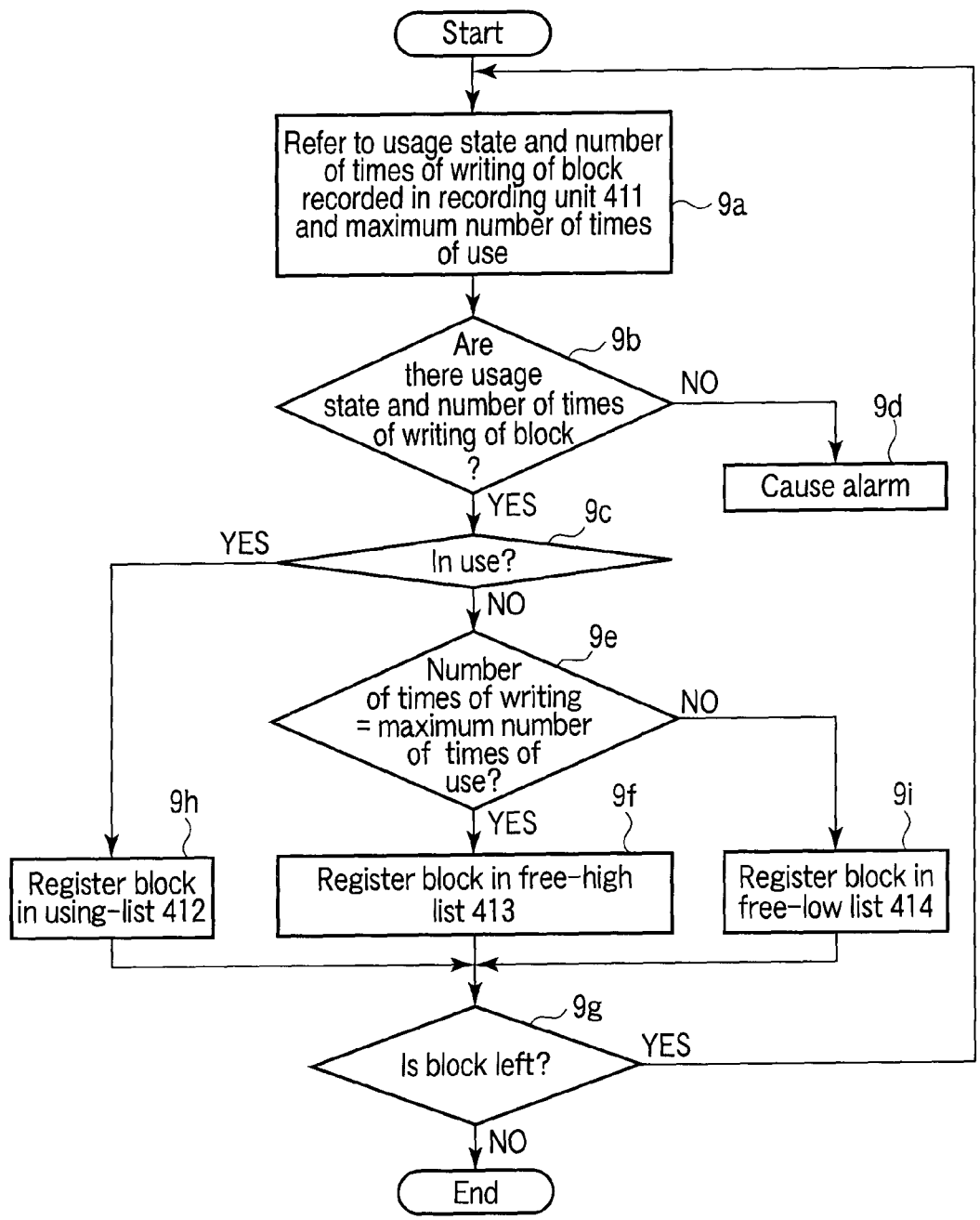
FIG. 9 is a flow chart showing operation of distributing blocks to lists upon start-up of the semiconductor memory information storage apparatus of FIG. 1.

FIG. 9 is a flow chart showing operation of distributing blocks to lists upon start-up of the semiconductor memory information storage apparatus according to the embodiment.

Upon start-up of the semiconductor memory information storage apparatus, the auxiliary controller 42 reads an in-use/unused classification result and the number of times of writing of each block recorded in the recording unit 411 block by block (step 9a). Subsequently, the auxiliary controller 42 determines whether or not the in-use/unused classification result and the number of times of writing of a block are correctly recorded (step 9b). If they are correctly recorded (Yes in step 9b), then the auxiliary controller 42 determines whether or not the block is in use (step 9c). If the in-use/unused classification result and the number of times of writing of the block are not correctly recorded (No in step 9b), the alarm occurs (step 9d).

If the block is not in-use (No in step 9c), then the auxiliary controller 42 determines whether or not the number of times of writing of the block is equal to the maximum number of times of use (step 9e). If the number of times of writing is equal to the maximum number of times of use (Yes in step 9e), then the auxiliary controller 42 registers the block in the free-high list 413 (step 9f), and determines whether or not an in-use/unused classification result and the number of times of writing of another block are recorded in the recording unit 411 (step 9g). If the in-use/unused classification result and the number of times of writing of another block are recorded in the recording unit 411 (Yes in step 9g), then the process moves to step 9a. If the in-use/unused classification result and the number of times of writing of another block are not recorded in the recording unit 411 (No in step 9g), then the process ends.

If, in step 9c, the block is in use (Yes in step 9c), then the auxiliary controller 42 registers the block in the using-list 412 (step 9h), and the process proceeds to step 9g. If, in step 9e, the number of times of writing is less than the maximum number of times of use (No in step 9e), then the auxiliary controller 42 registers the block in the free-low list 414 (step 9i), and the process proceeds to step 9g.

As described above, if blocks in the semiconductor memories 11 to 13 of the storage unit 1 are in use, the foregoing semiconductor memory information storage apparatus according to one embodiment registers the blocks in the using-list 412. If the blocks are unused, the semiconductor memory information storage apparatus registers in the free-high list 413 blocks with the number of times of writing being the maximum number of times of use, among the unused blocks. The semiconductor memory information storage apparatus registers in the free-low list 414 blocks with the number of times of writing being less than the maximum number of times of use, among the unused blocks. The semiconductor memory information storage apparatus selects a write block from the blocks registered in the free-low list 414, and writes content data in the write block. If content data is erased from a block, the semiconductor memory information storage apparatus registers the block in the free-high list 413 or the free-low list 414 on the basis of the number of times of writing and the maximum number of times of use. Thus, an unused block with a small number of times of writing is always registered in the free-low list 414. In other words, selecting a write block from the free-low list 414 enables content data to be written only in an unused block with a small number of times of writing.

Accordingly, an unused block with a small number of times of writing can be detected only by specifying a write block from blocks registered in the free-low list 414, and therefore the number of times of writing can be maintained to be uniform among blocks. This also leads to reduction in retrieval time, enabling a write block to be stably selected.

It should be noted that this invention is not limited to the foregoing embodiment. For example, while an example of storing content data with three semiconductor memories connected in parallel to one another has been described in the foregoing one embodiment, the same can be carried out in other cases where the number of semiconductor memories is not three (including the case of a single semiconductor memory).

Further, the invention may be embodied by modifying elements in the practical stage without departing from the scope of the invention. Various forms of the invention may be made by appropriately combining a plurality of components disclosed in the foregoing embodiment. For example, several components may be omitted from all the components disclosed in the embodiment.

The invention is preferable for use in a video data recording apparatus which records taken video.

What is claimed is:

1. A semiconductor memory information storage apparatus comprising:
    a storage unit which allows erasing stored contents data in units of blocks;
    a write number manager configured to count a number of times of writing the contents data to each block in the storage unit and manage the number of times for each block;
    a list manager configured to:
        manage, in a using list, first blocks in which the contents data is stored;
        manage, in a first unused list, second blocks in which the contents data is not stored and with the number of times of writing equal to a maximum value; and
        manage, in a second unused list, third blocks in which the contents data is not stored and with the number of times of writing less than the maximum value, the first, second, and third blocks being included among said blocks in the storage unit; and
    a controller configured to:
        select any of the third blocks and write the contents data to the selected block when writing control to the storage unit is carried out;
        erase the contents data stored in the storage unit in units of blocks when erasing control to the storage unit is carried out; and
        notify the list manager of a block from which the contents data is erased to update management of the notified block;
    wherein when any one of the third blocks is selected as a write block, the list manager removes the selected block from the second unused list and manages the selected block in the using list, and
    the write number manager increments the number of times of writing of the selected block;
    wherein when all blocks in which contents data is not stored is included in the second blocks, the list manager removes the second blocks from the first unused list, and manages the removed blocks in the second unused list.

2. The semiconductor memory information storage apparatus according to claim 1, wherein the list manager removes the block notified by the controller from the using list and compares the number of times of writing of the notified block with the maximum value, and manages the notified block in the second unused list in cases where the number of times of writing is less than the maximum value, manages the notified block in the first unused list in cases where the number of times of writing is equal to the maximum value, and removes the second blocks from the first unused list to manage the removed blocks in the second unused list and manages the notified block in the first unused list in cases where the number of times of writing is greater than the maximum value.

3. The semiconductor memory information storage apparatus according to claim 1,
    wherein the write number manager further records classification results of blocks in which contents data is stored and blocks in which contents data is not stored, wherein the blocks are included among said blocks in the storage unit, and
    the list manager refers to the numbers of times of writing and the classification results of all the blocks upon start-up so as to assign to the using list blocks in which contents data is stored, assign to the first unused list blocks in which contents data is not stored and with the number of times of writing equal to the maximum value, and assign to the second unused list blocks in which contents data is not stored and with the number of times of writing less than the maximum value.

4. A method of writing contents data to a storage unit which allows erasing stored contents data in units of blocks, the method comprising:
    managing, in a using list, first blocks which are included among said blocks in the storage unit and in which contents data is stored;
    managing, in a first unused list, second blocks which are included among said blocks in the storage unit and in which contents data is not stored and with a number of times of writing equal to a maximum value, the number of times of writing being the number of times of writing the contents data to each of the blocks in the storage unit;
    managing, in a second unused list, third blocks which are included among said blocks in the storage unit and in which contents data is not stored and with the number of times of writing less than a maximum value;
    when all blocks in which contents data is not stored are included in the second blocks, removing the second blocks from the first unused list, and managing the removed blocks in the second unused list;
    selecting any one of the third blocks;
    writing contents data to the selected block; and
    incrementing the number of times of writing of the selected block.

5. The method according to claim 4, comprising:
    erasing contents data stored in the storage unit in units of blocks;
    removing from the using list the erased block from which the contents data is erased;
    comparing the number of times of writing to the erased block with the maximum value;
    managing the erased block in the second unused list when the number of times of writing is less than the maximum value;
    managing the erased block in the first unused list when the number of times of writing is equal to the maximum value; and
    when the number of times of writing is greater than the maximum value, removing second blocks from the first unused list, managing the removed blocks in the second unused list, and managing the erased block in the first unused list.

6. The method according to claim 4, comprising:
    of the blocks in the storage unit, recording classification results of blocks in which contents data is stored and blocks in which contents data is not stored;
    upon start-up, by referring to the number of times of writing in all the blocks and the classification results, assigning blocks in which contents data is stored to the using list, assigning to a first unused list blocks in which contents data is not stored and with the number of times of writing equal to a maximum value, and assigning to a second unused list blocks in which contents data is not stored and with the number of times of writing less than the maximum value.

* * * * *